United States Patent
Stricot et al.

(10) Patent No.: US 6,767,142 B2
(45) Date of Patent: Jul. 27, 2004

(54) OPTOELECTRONIC EMITTER-RECEIVER DEVICE

(75) Inventors: Yves Stricot, Versailles (FR); Abdelkrim Belhora, Crosnes (FR)

(73) Assignee: FCI, Paris (FR)

( * ) Notice: Subject to any disclaimer, the term of this patent is extended or adjusted under 35 U.S.C. 154(b) by 182 days.

(21) Appl. No.: 10/046,327

(22) Filed: Oct. 26, 2001

(65) Prior Publication Data

US 2002/0146218 A1 Oct. 10, 2002

(30) Foreign Application Priority Data

Oct. 26, 2000 (FR) .......................................... 00 13767

(51) Int. Cl.⁷ ................................................. G02B 6/36
(52) U.S. Cl. ............................ 385/92; 385/90; 385/88; 385/89
(58) Field of Search ............................ 385/90, 88, 89, 385/92, 49, 14

(56) References Cited

U.S. PATENT DOCUMENTS

| | | | |
|---|---|---|---|
| 3,766,439 A | 10/1973 | Isaacson | 317/100 |
| 4,763,225 A | 8/1988 | Frenkel et al. | 361/388 |
| 5,011,256 A | 4/1991 | Johnson et al. | 350/96.2 |
| 5,241,614 A | 8/1993 | Ecker et al. | 385/94 |
| 5,396,573 A | 3/1995 | Ecker et al. | 385/88 |
| 5,598,033 A | 1/1997 | Behlen et al. | 257/686 |
| 5,768,456 A * | 6/1998 | Knapp et al. | 385/49 |
| 5,852,257 A | 12/1998 | Dittman et al. | 174/59 |
| 6,024,584 A | 2/2000 | Lemke et al. | 439/83 |
| 6,318,909 B1 * | 11/2001 | Giboney et al. | 385/90 |

FOREIGN PATENT DOCUMENTS

EP 0314651 A2 5/1989

OTHER PUBLICATIONS

IEEE 078035234 Mar. 1999, Electronic Competence & Technologic Conference, "The PONI–1 Parallel–Optical Link", Rosenberg et al.,.

* cited by examiner

Primary Examiner—Rodney Bovernick
Assistant Examiner—Sung Pak
(74) Attorney, Agent, or Firm—Perman & Green, LLP

(57) ABSTRACT

An optoelectric device (1) has an emitter and/or receiver (5) on a first element (13) of a printed circuit (2) of this device. Moreover, the device has at least one second printed-circuit element (32) such that the second element is not in alignment with the first element. And consequently, the device provides for the first element and the second element to be applied against separate and secant faces of a heatsink (4) of the device. The function of this heatsink is to evacuate the heat emitted by an optic connection provided on the device. The heatsink also permits supporting and holding the different portions of the printed circuit.

23 Claims, 1 Drawing Sheet

OPTOELECTRONIC EMITTER-RECEIVER DEVICE

Figure 1:
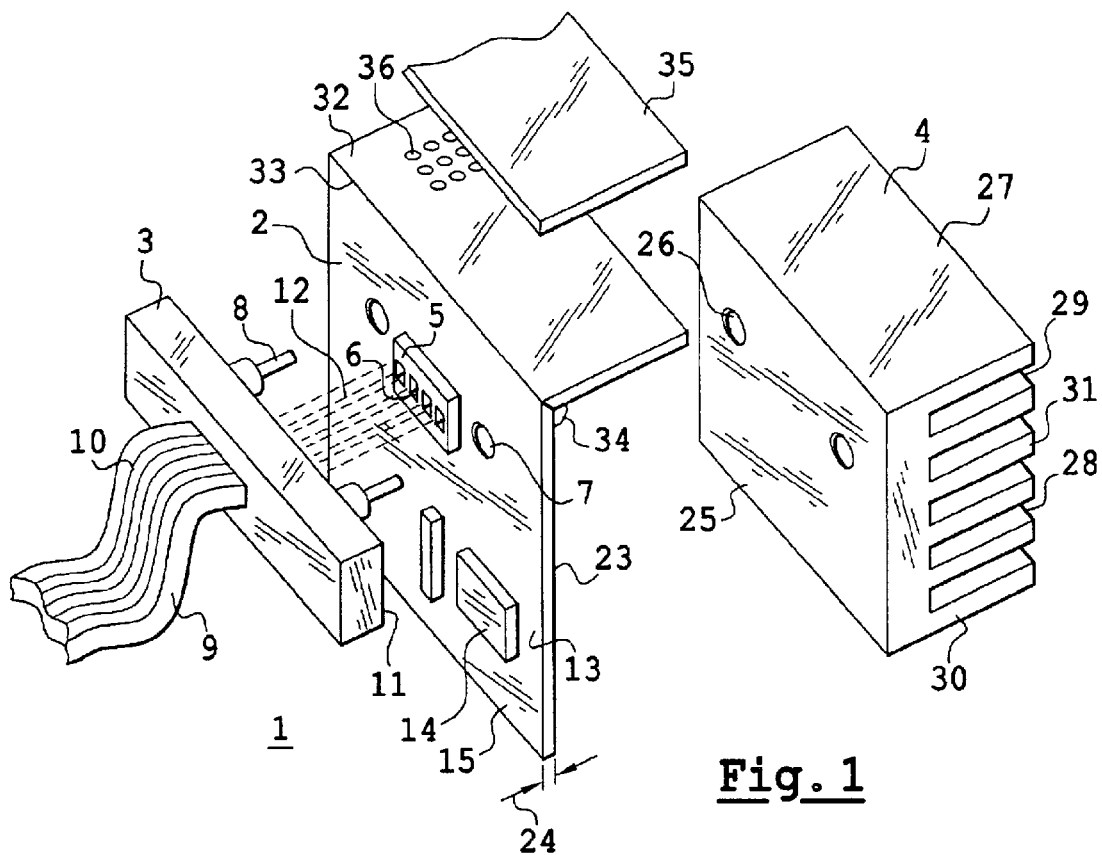

The subject of the present invention is an optoelectronic emitter and/or receiver device. It more particularly finds application in the field of high-rate optic connections, notably those respecting usage standards for telecommunications. In the prior art, a device of this type is known, which has a printed circuit on which is positioned an optic emitter-receiver, to emit or receive these optic signals that are exchanged with an optic connector positioned facing this optic emitter-receiver. Such devices dissipate a large amount of energy, and are generally provided with a heatsink or cooler in order to assure their cooling. The interest of the invention is that it presents an optoelectronic device provided with a heatsink, in such a way that the heatsink also serves for a mechanical support for the device.

In the prior art, a parallel optic connection is known from the teaching of document IEEE 078035234 3/99 Electronic Competence and Technologic Conference. This parallel optic connection uses an emitter-receiver and a complementary connector linked to an optical fiber. For this purpose, it has a printed circuit on which is present an emitter-receiver having aligned photodiodes, the printed circuit being designed so that the complementary connector can be mounted on the surface of this printed circuit and presented facing the optic emitter-receiver. For example, the complementary connector has optical-fiber ends connected to this connector with a spacing of its ends equal to the spacing between the photodiodes and the emitter-receiver.

Moreover, in order to assure the correct mounting of the complementary connector on the printed circuit, the printed circuit has two openings and the connector correspondingly has two guiding pins. The position of the optical fiber ends is precisely defined with respect to the guiding pins, and likewise, the position of the photodiodes is precisely defined with respect to the printed circuit openings. Thus, during the mounting of the complementary connector on the surface of the printed circuit, one ends up with a precision optic connection between the optical fibers and the optic emitter-receiver.

This parallel optic connection also has a metal base so as to be able to dissipate the heat emitted by the assembly of electronic components borne by the printed circuit, notably that emitted by the photodiodes. The metal base is a plate applied against one face of the printed circuit, preferentially facing the emitter-receiver. In a preferred example, this metal base also has alignment openings. Thus, the metal base can also receive centering pins from the complementary connector.

In this example, the printed circuit is flexible, and it has several segments permitting a connection with different devices. For example, a first segment is designed to be connected with the complementary connector. In this case, the metal base is applied against only this first segment. On the other hand, a second segment of the printed circuit is provided to be connected, by a bead soldering system, to another device, such as a motherboard, for example. Generally, such a device has a third printed-circuit segment, and said third segment is provided more particularly to receive passive components.

This optoelectronic device of the prior art poses a problem. In fact, such an optoelectronic device releases a great deal of heat. Now the metal base provided to serve as a heatsink is generally of a size that is smaller than the printed circuit. In fact, since the printed circuit is flexible, and the different segments of this circuit are not necessarily aligned, the metal base, which is a rigid plate, cannot follow the different segments of the printed circuit. Therefore, in general, the interest in this metal base is limited to the role of heatsink, in the very restricted zone where the latter is positioned.

Moreover, the flexible printed circuit risks being abraded at the level of the periphery of the metal base. In fact, since this metal base is local, it presents projecting boundary edges to the flexible printed circuit. For example, if the flexible printed circuit is curved in such a way that it is folded on the metal base, then the projecting boundary edges risk cutting the base locally. Moreover, since the metal base is of very fine thickness, this curvature of the flexible printed circuit can lead to the formation of a very crimped bend around this metal base and therefore risks adversely affecting the conductive strips provided in this area on the flexible printed circuit.

The object of the present invention is to solve the problem posed by the optoelectronic device of the prior art. In fact, the optoelectronic emitter and/or receiver device of the invention more particularly provides a device having a printed circuit such that this printed circuit is applied against a heatsink, this heatsink having a form such that it has several distinct faces. The printed circuit has at least one optic receiver and/or emitter, and can receive at least one complementary optic connector, such that the centering pins of this connector can be inserted into the openings of the circuit. In this connection position, the optic contacts of the complementary connector are positioned facing the contacts of the optic emitter-receiver of the circuit.

The printed circuit of the invention is particular since it has a first segment applied against a first face of the heatsink, and a second segment of this same printed circuit applied against a second face of this same heatsink. The particular quality of the invention resides in the fact that the two faces onto which the printed circuit is applied are separate, or, for example, contiguous. The printed circuit also has a flexible segment, such that this flexible segment assures a connection between the first segment and the second segment. The flexible segment permits notably placing the first and the second segments on different planes. Consequently, the heatsink plays a role of physical support for at least these two segments of the printed circuit, and protects them from adverse effects.

The invention therefore concerns an optoelectronic device having a first printed-circuit element, on which is mounted an optic emitter and/or receiver, this first printed-circuit element having at least two openings to receive the centering pins of an optic connector that can be mounted facing the optic emitter and/or receiver, this device also having a heatsink, being characterized in that the first printed-circuit element is applied against a first face of the heatsink, and in that a segment of the flexible printed circuit connects the first printed-circuit element to a second printed-circuit element, this second printed-circuit element being applied against a second face of the heatsink, this second face being separate from the first face.

Figure 2:
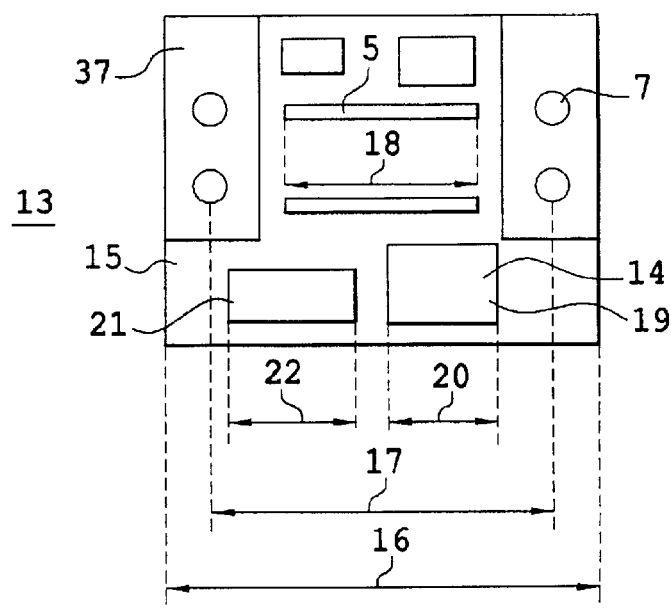

The invention will be better understood upon reading the description which follows and upon examination of the figures that accompany it. The latter are given only by way of indication and do not in any way limit the invention. The figures show:

FIG. 1: An exploded view in perspective of an optoelectronic device according to the invention;

FIG. 2: A view of one face of a printed-circuit element of an optoelectronic device according to the invention.

FIG. 1 shows an optoelectronic device 1 according to the invention. The device 1 has a printed circuit 2, a connector 3, and a heatsink 4. Printed circuit 2 has an optic emitter-receiver 5. Optic emitter-receiver 5 has optic contacts 6 to respectively send or receive optic signals. Emitter-receiver 5 is an electro-optic transformation component. For example, emitter-receiver 5 is a matrix of diodes called VCSEL (Vertical Cavity Solid Emitting Laser), or a PIN photodiode matrix. In one variant, optic contacts 6 are diodes, solely for emitting a signal. In this variant, emitter and/or receiver 5 is a simple optic emitter.

Emitter-receiver 5 can also be a zone of the printed circuit allowing the ends of optical fibers to flare out, since these optical fibers, for example, can be included in the thickness of the printed circuit. Then optic contacts 6 correspond to these optical-fiber ends.

Printed circuit 2 also has two openings 7, these openings 7 being preferentially positioned on either side of emitter-receiver 5. Openings 7 then form a pair. They are precisely positioned relative to optic contacts 6. In one variant, one can provide for printed circuit 2 to have several openings such as 7, and then in one preferred mode of embodiment of this variant, it can have several pairs of openings 7.

Openings 7 are more particularly provided to receive centering pins. For this purpose, centering pins 8 are present on optic connector 3 in order to be able to place this optic connector 3 in a correct manner on the printed circuit. In addition, centering pins 8 are precisely positioned relative to the optic contacts (not shown) of connector 3. In fact, the face-to-face positioning of connector 3 with emitter-receiver 5 requires a very great precision given the precision required for optic connections in general.

Connector 3, for example, is connected to a cable 9 comprised of optical fibers 10. Optical fibers 10, for example, are arranged inside connector 3 in such a way that the ends (not shown) of these optical fibers 10 are flared out at the level of a front face 11 of connector 3. This front face 11 is designed to be placed facing contact matrix 6.

The flared ends of optical fibers 10 are then placed face-to-face with optic contacts 6.

Moreover, optic contacts 6 are spaced so that a spacing between these optic contacts is of the order of the spacing of those [fiber ends] presented on connector 3. When connector 3 is mounted on printed circuit 2, centering pins 8 cooperate with openings 7 when connector 3 is positioned correctly with printed circuit 2, so as to assure a correct optic pathway between these two elements.

Emitter-receiver 5 is more particularly positioned on a first element 13 of printed circuit 2. This first element 13, for example, has other electronic devices 14 mounted at the surface of a face 15 of this element 13. Emitter-receiver 5 is also present on this face 15. For example, a device 14 can be an amplifier, or a signal processing component. In this case, the first element 13 has strips (not shown) permitting connecting optic emitter-receiver 5 with these other devices 14. As shown in FIG. 2, this first element 13, in one preferred example of embodiment, has two emitter-receivers such as 5. Printed circuit 2 can thus receive one or two connectors. In this example, the first element 13 has two pairs of openings 7. The openings of a pair are respectively positioned on either side of emitter-receiver 5 presented on this face 15. In such a case, a complementary connector having two pairs of centering pins such as 8 can be mounted on this printed circuit 2.

First element 13, for example, is very small in size. For example, a width 16 of this element 13 is of the order of 10 millimeters. In a preferred example, first element 13 has a square shape. In this preferred example, a space 17 between two openings 7 of the same pair is of the order of 6.5 millimeters. Consequently, a width 18 of an emitter-receiver 5 is smaller than space 17. For example, this width 18 is of the order of 2 to 2.5 millimeters. Moreover, this face 15 has an amplifier 19, such that amplifier 19 has, for example, a width of the order of 1.7 millimeters. Moreover, face 15 can also have a drive circuit 20 of a width of the order of approximately 2 millimeters.

First element 13 of printed circuit 2 has face 15, and also a second face 23. This second face 23 is opposite [on the back of] face 15, while being parallel to it. The first element 13 is a plate of a small thickness 24. Face 23 is applied against heatsink 4. In the example shown in FIG. 1, face 23 is applied against a first face 25 of this heatsink 4.

In a preferred mode of embodiment, this first face 25 also has openings 26, such that, when first element 13 is applied against first face 25, openings 7 are positioned facing openings 26. For this purpose, first face 25 has at least one pair of openings 26 to be placed opposite the pair of openings such as 7. Thus, when connector 3 is mounted on face 15 of first element 13 of printed circuit 2, centering pins 8 can also be inserted into opening 26, and held there. Thus, openings 26 can participate in a correct positioning of connector 3 on printed circuit 2.

Heatsink 4 is preferentially made of a material permitting dissipating a large quantity of heat. It is characterized by good heat exchange capability.

Heatsink 4 permits making rigid the overall structure of this device 1. For example, heatsink 4 is a module of parallelepiped form thus having a second face 27. This second face 27 is separate from first face 25. In the example shown in FIG. 1, the second face 27 is a secant with regard to first face 25. In a preferred mode of embodiment, face 25 is perpendicular to second face 27. For example, heatsink 4 can have a perforated face 28. This perforated face 28 can have one or more cavities 29. Cavities 29 are hollow toward the inside of the parallelepiped formed by heatsink 4. In the example shown in FIG. 1, cavities 29 also open onto at least one other face 30 of heatsink 4. Cavities 29 are separated from one another by walls 31 of a certain thickness. Moreover, the total surface created by such a heatsink 4 is clearly increased by the interplay of these cavities 29 and walls 31. The increase in the contact surface between the external environment, for example, air, and the heatsink permits a better dissipation of heat.

Printed circuit 2 also has a second printed-circuit element 32. Second element 32 is connected to first element 13 by means of a segment of flexible printed circuit 33. In this example, printed circuit 2 at least has the following three segments: first element 13, second element 32 and flexible segment 33. By the play of flexible segment 33, the printed-circuit elements 13 and 32 can be placed in different planes. In fact, flexible circuit 33 can be positioned so as to form an elbow 33. In a preferred example, elbow 33 forms an angle 34 of the order of 90°.

In the example shown in FIG. 1, first element 13 and second element 32 are made up of rigid printed-circuit segments, while segment 33 is flexible. In one variant, segments 13, 32 and 33 can all be flexible. In this case, printed circuit 2 is made up of a single continuous piece, and the segments correspond simply to different orientations. Segments 13, 32 and 33 of printed circuit 2 are applied to the periphery of heatsink 4.

The second printed-circuit element 32 therefore has a surface complementary to first element 13 to receive connectors, and/or components, and/or still other electronic devices to be connected with device 1. For example, the second printed-circuit element 32 can receive the connection elements permitting the coupling of device 1 to a complementary device 35, for example, on a motherboard. In a preferred mode of embodiment, the connection between the second element 32 and complementary device 35, for example, is assured by a system of microbeads. The electrical and physical bond created by the microbead system is more particularly described in documents U.S. Pat. Nos. 6,024,584 and 5,598,033. The connection is then assured by solder beads 36, beads 36 being positioned so as to form a pattern respecting a certain geometry to allow a unique correct connection of complementary device 35 that can be connected with second element 32. Beads 36 are microsoldered, and are currently called "ball grid array", according to the Anglo-Saxon terminology, by the person with average skill in the art.

In the mode of embodiment where the printed circuit is entirely flexible and in which first element 13 and second element 32 are also flexible, such as shown in FIG. 2, device 1 has reinforcing plates 37. Reinforcing plates 37 permit making the printed circuit rigid. These reinforcing plates 37 are more particularly positioned at the level of openings 7. Moreover, these reinforcing strips 37 are generally arranged on a periphery of the printed-circuit elements 2 in order to facilitate their handling and to prevent incorrect positioning of flexible printed circuit 33. In fact, if the printed circuit is flexible, the zone where the bend must be made is uncertain, but in the presence of reinforcing plates 37, these folding zones are limited, and thus a correct placement of printed circuit 2 on heatsink 4 is assured. In fact, there is a preferred position for segment 13 relative to first face 25 and of second element 32 relative to second face 27.

These reinforcing plates can be of a thickness calibrated so as to control the space between the surface of optic components 6 and the end of fibers 10.

What is claimed is:

1. Optoelectronic device having a first printed-circuit element, on which is mounted an optic emitter and/or receiver, having openings to receive centering pins of a complementary optic connector to be mounted facing said optic emitter an/or receiver, said optoelectronic device being provided further with a heatsink, wherein said first printed-circuit element is applied against a first face of said heatsink, and wherein a flexible printed-circuit segment connects said first printed circuit element to a second printed-circuit element wherein one of said first and second printed-circuit elements is rigid, this second printed-circuit element being applied against a second face of the heatsink, this second face being separate from the first face.

2. Optoelectronic device according to claim 1, wherein said openings comprise holes located on said first printed circuit element.

3. Device according to claim 1, wherein said first face is a secant relative to the second face, and in that said flexible printed-circuit segment forms an elbow.

4. Device according to claim 3, wherein said elbow forms an angle of approximately 90 degrees.

5. Device according to claim 1, wherein said first face and said second face are part of two planes intersecting each other, and in that said flexible printed-circuit segment forms an elbow linking said first and second printed circuit elements.

6. Device according to claim 1, wherein at least one of said first and second printed-circuit elements is flexible and forms a single printed circuit with said printed-circuit flexible segment.

7. Device according to claim 1, wherein the heatsink has two receptacles on its first face, these receptacles being at least a part of said openings and providing holding of the centering pins.

8. Device according to claim 1, wherein said optic receiver is positioned between said openings.

9. Device according to claim 2, wherein said optic receiver is positioned between said holes.

10. Device according to claim 1, wherein said second printed-circuit element has microbeads for connection with another device such as a motherboard.

11. Device according to claim 10, wherein said second printed-circuit element has contact areas receiving contact studs of an intermediate connector coupling said second element of said printed circuit to an electronic board.

12. Optoelectronic device according to claim 10, wherein said openings to receive said centering pins comprise holes located on said first printed circuit element.

13. Device according to claim 10, wherein said first face and said second face are part of two planes intersecting each other, and in that said flexible printed-circuit segment forms an elbow linking said first and second printed circuit elements.

14. Device according to claim 10, wherein at least one of the first and second printed-circuit elements is rigid.

15. Device according to claim 10, wherein at least one of the first and second printed-circuit elements is flexible and forms a single printed circuit with the printed-circuit flexible segment.

16. Device according to claim 10, wherein the heatsink has two receptacles on its first face, these receptacles being positioned facing said openings and providing holding of the centering pins.

17. Device according to claim 10, wherein said optic receiver is positioned between said openings.

18. Device according to claim 10, wherein said second printed-circuit element has microbeads for connection with another device.

19. Device according to claim 10, wherein said intermediate connector is made up of two elements interconnectable by complementary coupling terminations on an interconnection face, at least the element in contact with the second printed-circuit element being provided with solder microbeads on its face for connection with the second printed-circuit element.

20. The device of claim 18 wherein another device comprises a mother board.

21. The optoelectronic device of claim 1 wherein the first printed circuit element is rigid.

22. The optoelectronic device of claim 1 wherein the second printed circuit element is rigid.

23. The device of claim 1 wherein the first printed circuit element and the second printed circuit element are discontinuous segments joined together by the flexible printed-circuit segment.

* * * * *